(12) United States Patent
Yamada et al.

(10) Patent No.: US 11,134,596 B2
(45) Date of Patent: Sep. 28, 2021

(54) WORK MACHINE

(71) Applicant: FUJI CORPORATION, Chiryu (JP)

(72) Inventors: Shuhei Yamada, Chiryu (JP); Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 291 days.

(21) Appl. No.: 16/476,136

(22) PCT Filed: Jan. 17, 2017

(86) PCT No.: PCT/JP2017/001414
§ 371 (c)(1),
(2) Date: Jul. 5, 2019

(87) PCT Pub. No.: WO2018/134893
PCT Pub. Date: Jul. 26, 2018

(65) Prior Publication Data
US 2019/0350112 A1 Nov. 14, 2019

(51) Int. Cl.
*H05K 13/04* (2006.01)
(52) U.S. Cl.
CPC ..... *H05K 13/0406* (2018.08); *H05K 13/0409* (2018.08); *H05K 13/0411* (2018.08); *Y10T 29/53174* (2015.01)
(58) Field of Classification Search
CPC ............... H05K 13/04; H05K 13/0404; H05K 13/0406; H05K 13/0408; H05K 13/0409; H05K 13/041; H05K 13/0411; H05K 13/0452; Y10T 29/53174; Y10T 29/53178;
(Continued)

(56) References Cited

U.S. PATENT DOCUMENTS

2003/0088974 A1* 5/2003 Nakamura ............. H05K 13/02
29/740
2006/0042075 A1 3/2006 Nakai et al.

FOREIGN PATENT DOCUMENTS

| EP | 0 982 980 B1 | 3/2003 |
| JP | 9-150330 A | 6/1997 |
| JP | 2000-69781 A | 3/2000 |

(Continued)

OTHER PUBLICATIONS

International Search Report dated Apr. 25, 2017 in PCT/JP2017/001414 filed on Jan. 17, 2017.

(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A frame structure of a work machine includes a left frame in which a first left rail of a first guide device is provided at a lower portion thereof; a right frame in which a second right rail of a second guide device is provided at a lower portion thereof; a center frame disposed between the left frame and the right frame and in which a first right rail of the first guide device and a second left rail of the second guide device are provided at a lower portion thereof; a front frame connecting a pair of front columns together and also connecting respective front ends of the left frame, the right frame, and the center frame; and a rear frame connecting a pair of rear columns together and also connecting respective rear ends of the left frame, the right frame, and the center frame.

12 Claims, 6 Drawing Sheets

(58) Field of Classification Search
CPC . Y10T 29/53187; Y10T 29/53191; B25J 9/02
See application file for complete search history.

(56) References Cited

FOREIGN PATENT DOCUMENTS

| | | |
|---|---|---|
| JP | 2005-64222 A | 3/2005 |
| JP | 2009-272555 A | 11/2009 |
| JP | 2012-33736 A | 2/2012 |
| JP | 2012-44128 A | 3/2012 |
| JP | 2015-15410 A | 1/2015 |

OTHER PUBLICATIONS

Extended European Search Report dated Dec. 2, 2019 in European Patent Application No. 17892443.7, 11 pages.

* cited by examiner

WORK MACHINE

TECHNICAL FIELD

The present application relates to a work machine.

BACKGROUND ART

Patent literature 1 discloses, as a work machine for performing various types of work by moving a head, a component mounter for mounting electronic components on circuit boards. Among guide devices for moving a head in such a work machine, there are guide devices which are of a suspension type in which a moving body of the guide device is supported by being suspended from a rail. Such suspension type guide devices have a configuration like one described, for example, in patent literature 1, in which a pair of rails and a drive device for applying a driving force to the moving body are disposed on a frame spanning a front column and a rear column.

PATENT LITERATURE

Patent Literature 1: JP-A-2012-044128

BRIEF SUMMARY

Technical Problem

For work machines like the one described above, there is a demand to improve the working accuracy by reducing the effect of vibrations caused by the moving head. In addition, in order to improve the productivity per installation area, it is desirable for the work machines to be made smaller. An object of the present description is to provide a work machine which improves the rigidity of the entire machine to reduce the effect of vibrations caused by a moving head thereof.

Solution to Problem

The present description discloses a first work machine including: a base; a pair of front columns provided on left and right sides of a front portion of the base; a pair of rear columns provided on left and right sides of a rear portion of the base; a frame structure spanning the pair of front columns and the pair of rear columns; a first head and a second head both configured to perform predetermined work in movable ranges defined so as not to overlap each other above the base; a first guide device provided on the frame structure on a left side of the center of the base in a left-right direction thereof and configured to allow the first head to move in a front-rear direction of the base, and a second guide device provided on the frame structure on a right side of the center of the base in the left-right direction thereof and configured to allow the second head to move in the front-rear direction of the base; wherein the first guide device further comprises: a first left rail and a first right rail both extending in the front-rear direction of the base, the first left rail and the first right rail being parallel, and a first moving body provided so as to move in the front-rear direction of the base while being suspended from the first left rail and the first right rail and supporting the first head; wherein the second guide device further comprises:

a second left rail and a second right rail both extending in the front-rear direction of the base, the second left rail and the second right rail being parallel, and a second moving body provided so as to move in the front-rear direction of the base while being suspended from the second left rail and the second right rail and supporting the second head; and wherein the frame structure further comprises: a left frame in which the first left rail of the first guide device is provided at a lower portion thereof; a right frame in which the second right rail of the second guide device is provided at a lower portion thereof; a center frame, being disposed between the left frame and the right frame, in which the first right rail of the first guide device and the second left rail of the second guide device are provided at a lower portion thereof; a front frame connecting the pair of front columns together and also connecting respective front ends of the left frame, the right frame, and the center frame together, and a rear frame connecting the pair of rear columns together and also connecting respective rear ends of the left frame, the right frame, and the center frame together.

The present description discloses a second work machine including: a base; a pair of front columns provided on left and right sides of a front portion of the base; a pair of rear columns provided on left and right sides of a rear portion of the base; a frame structure spanning the pair of front columns and the pair of rear columns; a first head configured to perform predetermined work in a movable range defined above the base, and a first guide device provided on the frame structure and configured to allow the first head to move in a front-rear direction of the base, wherein the first guide device further comprises: a first left rail and a first right rail both extending in the front-rear direction of the base, the first left rail and the first right rail being parallel, and a first moving body, being provided so as to move in the front-rear direction of the base, while being suspended from the first left rail and the first right rail, and supporting the first head, wherein the frame structure further comprises: a left frame in which the first left rail of the first guide device is provided at a lower portion thereof; a right frame in which the first right rail of the first guide device is provided at a lower portion thereof; a front frame connecting the pair of front columns together and also connecting respective front ends of the left frame and the right frame together, and a rear frame connecting the pair of rear columns together and also connecting respective rear ends of the left frame and the right frame together; and wherein the first left rail and the first right rail of the first guide device are disposed respectively in ranges where the movable range of the first head overlaps left and right support ranges defined in a left-right direction of the base where the pair of front columns and the pair of rear columns are connected to the frame structure.

Advantageous Effects

With the configuration of the first work machine, the pair of front columns and the pair of rear columns are connected together by the frame structure including the left and right frames, the front and rear frames, and the center frame. As a result, the work machine improves the overall rigidity of the work machine with the structural rigidity of the frame structure while maintaining the overall external dimensions of the work machine. Thus, the frequency of vibrations caused in association with movement of the first head and the second head can be increased, which facilitates suppressing and controlling the vibrations. As a result, the effect of the vibrations can be reduced to thereby improve the working efficiency of the work machine. In addition, the frame structure supports the first guide device and the second guide device, which are both suspended, as a result of the rails being provided individually at the lower portions of the left frame, the right frame, and the center frame. As a result, the work machine can reliably bear the loads of the first guide device and the second guide device and suppress the occurrence of vibrations that would otherwise be caused in association with movement of the first head and the second head.

With the configuration of the second work machine, the pair of front columns and the pair of rear columns are connected together by the frame structure including the left and right frames and the front and rear frames. As a result, the work machine improves the overall rigidity of the work machine with the structural rigidity of the frame structure while maintaining the overall external dimensions of the work machine. Thus, since the frequency of the vibrations caused in association with movement of the first head can be increased, which facilitates suppressing and controlling the vibrations As a result, the effect of the vibrations can be reduced to thereby improve the working efficiency of the work machine. The frame structure supports the first guide device, which is suspended, with the individual rails provided at the lower portions of the left frame and the right frame. As a result, the work machine can reliably bear the load of the first guide device and can suppress the occurrence of vibrations that would otherwise be caused in association with movement of the first head.

DESCRIPTION OF EMBODIMENTS

1. First Embodiment

Hereinafter, an embodiment of a work machine will be described by reference to the drawings. A work machine performs various types of work by moving a head. In this embodiment, the work machine is described as a component mounter. The component mounter is a production device for producing board products by mounting electronic components in predetermined mounting positions on circuit boards. Hereinafter, a "circuit board" will simply be referred to as a "board", and an electronic component will simply be referred to as a "component".

1-1. Configuration of Component Mounter 1

Figure 1:
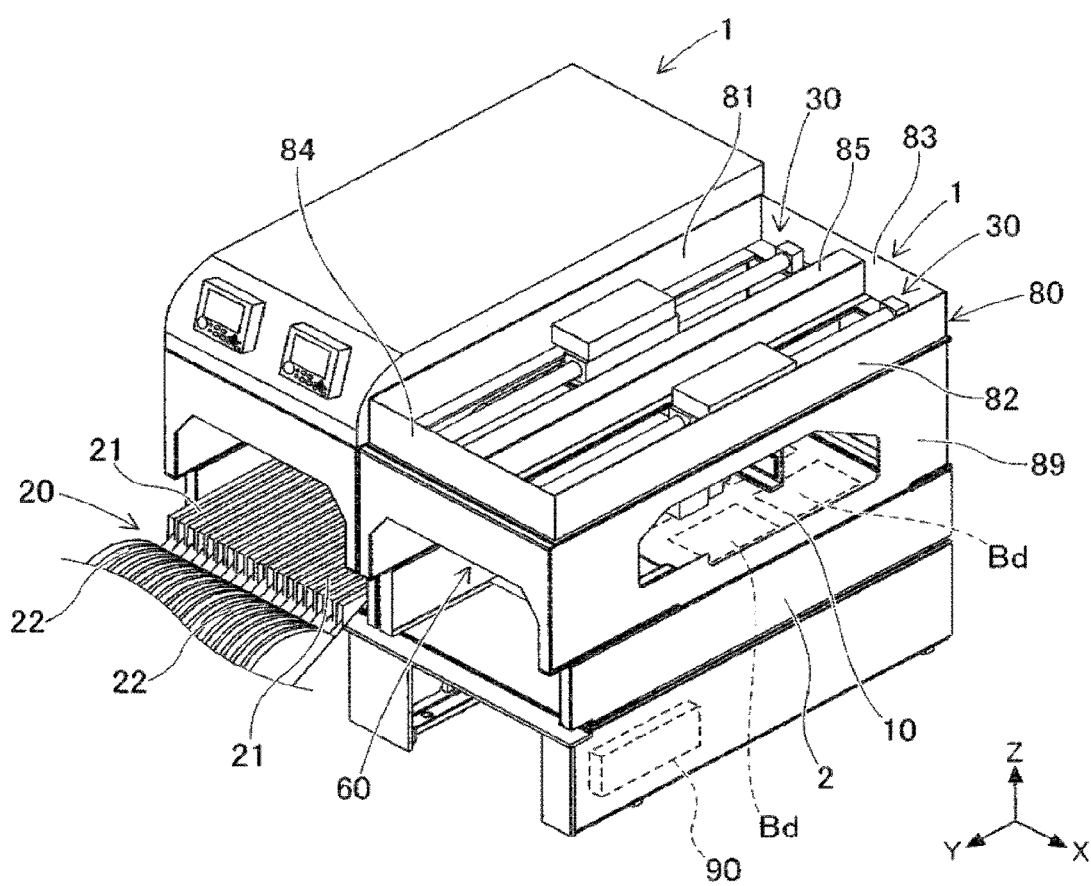
FIG. 1 A perspective view illustrating two component mounters of a first embodiment, with a component supply device, upper covers, and a control panel being omitted from one of the two component mounters.

As illustrated in FIG. 1, multiple component mounters 1 are provided to be aligned side by side in, for example, a direction in which boards Bd are conveyed, constituting a production line for producing board products. Each component mounter 1 includes base 2, board conveyance device 10, component supply device 20, two component transfer devices 30, front column member 60, rear column member 70, frame structure 80, control device 90, and the like.

In the following description, a horizontal width direction of component mounter 1 (a direction directed from an upper left to a lower right in FIG. 1) is referred to as an X-axis direction or a left-right direction. A horizontal depth direction of component mounter 1 (a direction directed from a lower left to an upper right in FIG. 1) is referred to as a Y-axis direction or a front-rear direction. A vertical direction perpendicular to an X-axis and a Y-axis (an up-down direction in FIG. 1) is referred to as a Z-axis direction or an up-down direction.

Board conveyance device 10 is placed on base 2 and is made up of a belt conveyor or the like. Board conveyance device 10 conveys boards Bd sequentially in a conveyance direction (in an X-axis direction in this embodiment). Board conveyance device 10 locates board Bd in a predetermined position inside component mounter 1. Then, after component mounter 1 has performed a mounting process on board Bd, board conveyance device 10 conveys board Bd so processed outside of component mounter 1.

Component supply device 20 is placed on base 2 and supplies components to be mounted on boards Bd. Component supply device 20 includes multiple feeders 21 that are set individually in multiple slots disposed side by side in the X-axis direction in a replaceable fashion. A carrier tape installing with a number of components is wound around supply reel 22 and is loaded in each feeder 21. Feeder 21 feeds out the carrier tape to supply a component to a supply position located at a distal end of feeder 21 so that the component can be picked up there.

Each of two component transfer devices 30 is used for a mounting process of picking up a component supplied by component supply device 20 and then mounting the component on board Bd. In this embodiment, two component transfer devices 30 are disposed to be aligned side by side in the left-right direction of component mounter 1 and are supported by frame structure 80. The detailed configuration of two component transfer devices 30 will be described later.

Figure 2:
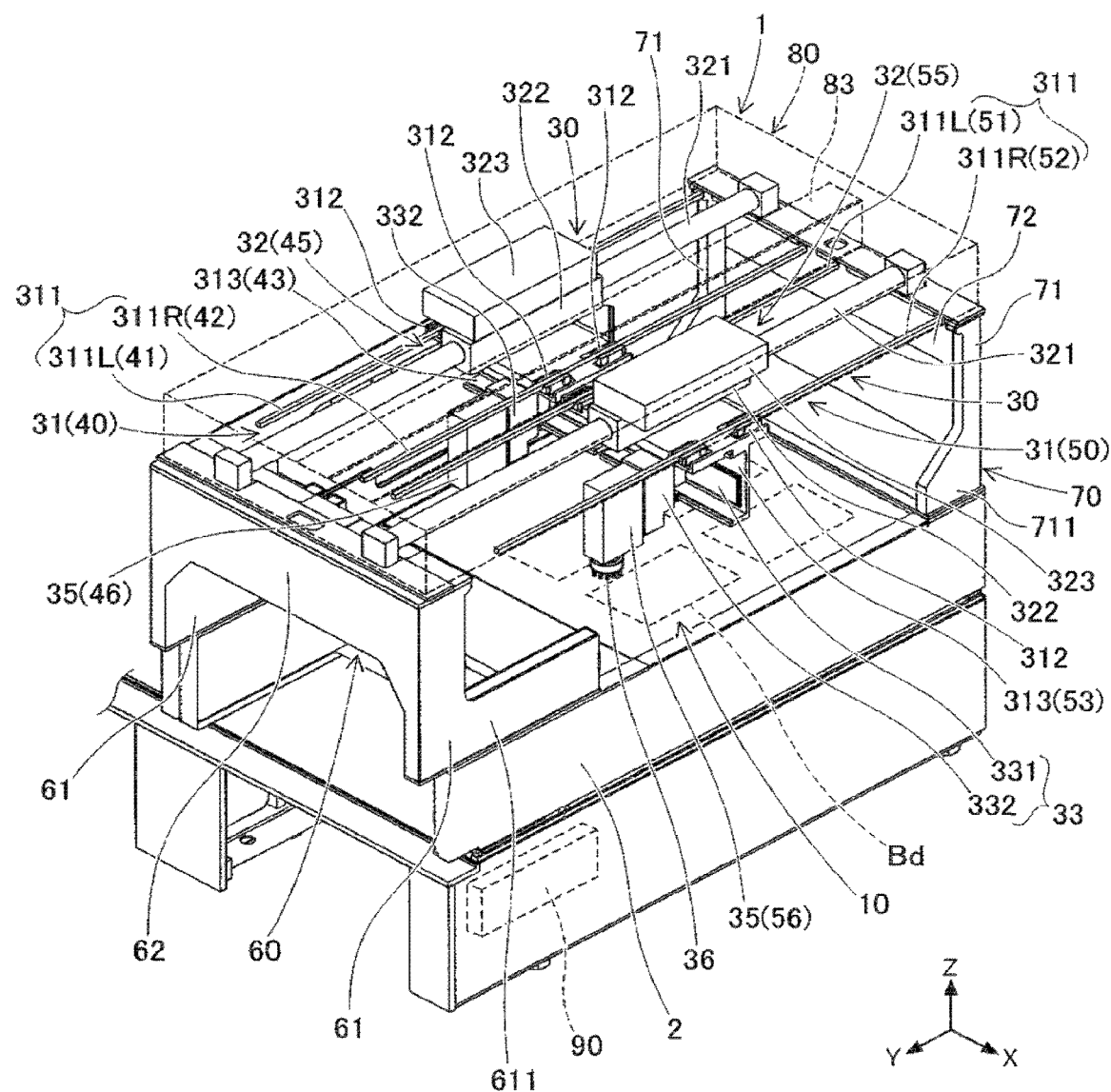
FIG. 2 An enlarged perspective view illustrating one of the two component mounters in FIG. 1.

As illustrated in FIG. 2, front column member 60 includes pair of front columns 61 and connecting member 62. Pair of front columns 61 are provided at left and right sides of a front portion of base 2. In this embodiment, pair of front columns 61 are connected together at front end portions by connecting member 62 extending in a left-right direction of base 2 to form an integral portal-like structure.

Rear column member 70 is disposed separated from front column member 60 in the front-rear direction of base 2. Rear column member 70 includes pair of rear columns 71 and a connecting member 72. Pair of rear columns 71 are provided at left and right sides of a rear portion of base 2. In this embodiment, pair of rear columns 71 are connected together by connecting member 72 extending in the left-right direction of base 2 to form an integral portal-like structure.

Frame structure 80 spans pair of front columns 61 and pair of rear columns 71. Frame structure 80 is a strength member configured not only to support two component transfer devices 30 but also to connect front column member 60 and rear column member 70 together to thereby improve the overall rigidity of the work machine. A detailed configuration of frame structure 80 will be described later.

Control device 90 is made up mainly of CPU, various memories, and a control circuit. Control device 90 executes a mounting process of mounting components on boards Bd. The mounting process is executed based on a control program and constitutes a pick and place cycle of picking up a component supplied by component supply device 20 and transferring the component to a predetermined mounting position on board Bd repeatedly multiple times.

In addition, in the mounting process, when controlling the operation of mounting heads 35, which will be described later, control device 90 receives information outputted from various sensors provided in component mounter 1, and the result of a recognition process by image processing or the like. Then, the control device sends control signals to component transfer devices 30 based on the control program, information from the various sensors, and the results of the various recognition processes. As a result, positions and angles of components held by mounting heads 35 are controlled.

To improve further the accuracy of the mounting process, control device 90 suppresses and controls vibrations generated in association with the operation of mounting heads 35. For example, when moving mounting head 35 to a position above a mounting position while executing the mounting process, control device 90 calculates the time it takes until the amplitude of vibration generated in association with the movement of mounting head 35 is dampened to be equal to or less than an allowable value based on a starting position and an ending position of the movement of mounting head 35, a traveling speed of mounting head 35, a mass of the moving member, and the like. Then, after having waited for the calculated dampening time to elapse, control device 90 lowers suction nozzle 36 holding a component and mounts the component in a predetermined mounting position on board Bd. An improvement in the accuracy of the mounting process is achieved by executing the mounting process while controlling the vibration in the way described above.

Additionally, since vibrations generated during execution of a mounting process by component mounter 1 generate a waiting time corresponding to a dampening time, the vibrations constitute a cause that extends the cycle time necessary for the mounting process. Here, the frequency of vibrations generated in component mounter 1 tends to increase as the rigidities of the constituent members thereof increase, and the dampening time decreases as the frequency increases. By increasing the rigidities of the constituent members of component mounter 1, a waiting time attributed to vibrations generated in a mounting process can be expected to be shortened. Therefore, in component mounter 1, it is desirable that frame structure 80 is highly rigid, frame structure 80 being a frame structure connecting front column member 60 and rear column member 70 provided on base 2 and supporting two component transfer devices 30.

1-2. Detailed Configuration of Component Transfer Device 30

As illustrated in FIG. 2, component transfer device 30 includes Y-axis guide device 31, linear motor 32, X-axis guide device 33, and mounting head 35. Y-axis guide device 31 moves mounting head 35 in a front-rear direction (a Y-axis direction) of base 2. Y-axis guide device 31 includes pair of guide rails 311, four guide blocks 312, and Y-axis moving body 313. Pair of guide rails 311 is made up of left rail 311L and right rail 311R that both extend in the front-rear direction of base 2 and are disposed parallel to each other.

Four guide blocks 312 are each in slidable engagement with pair of guide rails 311. Y-axis moving body 313 is fixed to lower portions of four guide blocks 312. As a result, Y-axis moving body 313 can move in the front-rear direction of base 2 while being suspended from left rail 311L and right rail 311R. As described above, Y-axis guide device 31 is of a suspension type in which Y-axis moving body 313 is supported while being suspended from pair of guide rails 311, allowing a large movable range to be ensured in a left-right direction.

Linear motor 32 includes motor shaft 321, motor block 322, and cooling device 323. Motor shaft 321 is a fixed member that is disposed parallel to pair of guide rails 311 in a space defined in the Y-axis direction between pair of guide rails 311. Multiple ring-like permanent magnets are disposed on motor shaft 321 along an axial direction. The multiple permanent magnets are disposed in such a manner that magnetic poles of two adjacent magnets differ from each other.

Motor block 322 is a movable device that is disposed on motor shaft 321 so as to slide over motor shaft 321 in a direction in which motor shaft 321 extends. Motor block 322 include multiple inductors that are disposed along the extending direction of motor shaft 321. Cooling device 323 is made up of a heat conductive pipe, a fan, and the like, all of which are not illustrated. Cooling device 323 dissipates heat generated as a result of driving of linear motor 32 to an exterior portion to thereby cool linear motor 32.

Y-axis moving body 313 of Y-axis guide device 31 is fixed to a lower portion of motor block 322 of linear motor 32. Linear motor 32 generates a thrust by feeding the inductors of motor block 322. Linear motor 32 moves Y-axis moving body 313 fixed to motor block 322 to a predetermined position in the Y-axis direction by controlling the feeding of the inductors.

X-axis guide device 33 moves mounting head 35 in a left-right direction (an X-axis direction) of base 2. X-axis guide device 33 includes X-axis rail 331 and X-axis moving body 332. X-axis rail 331 is disposed on Y-axis moving body 313 in such a manner as to extend in the X-axis direction. X-axis moving body 332 is in slidable engagement with X-axis rail 331. X-axis moving body 332 is moved to a predetermined position in the X-axis direction by a drive device, not illustrated. To the drive device, for example, a ball screw device or a linear motor can be applied.

Mounting head 35 is fixed to X-axis moving body 332 by a clamp, not illustrated. Mounting head 35 includes multiple suction nozzles 36 that are provided detachably. Mounting head 35 supports suction nozzles 36 individually in such a manner as to be revolved around an R axis parallel to a Z axis and lifted up and down. The lifting and lowering position and angle of each suction nozzle 36 relative to mounting head 35, along with the supply of negative pressure, are controlled. When supplied with negative pressure, each suction nozzle 36 picks up through suction a component supplied by feeder 21 of component supply device 20.

Figure 3:
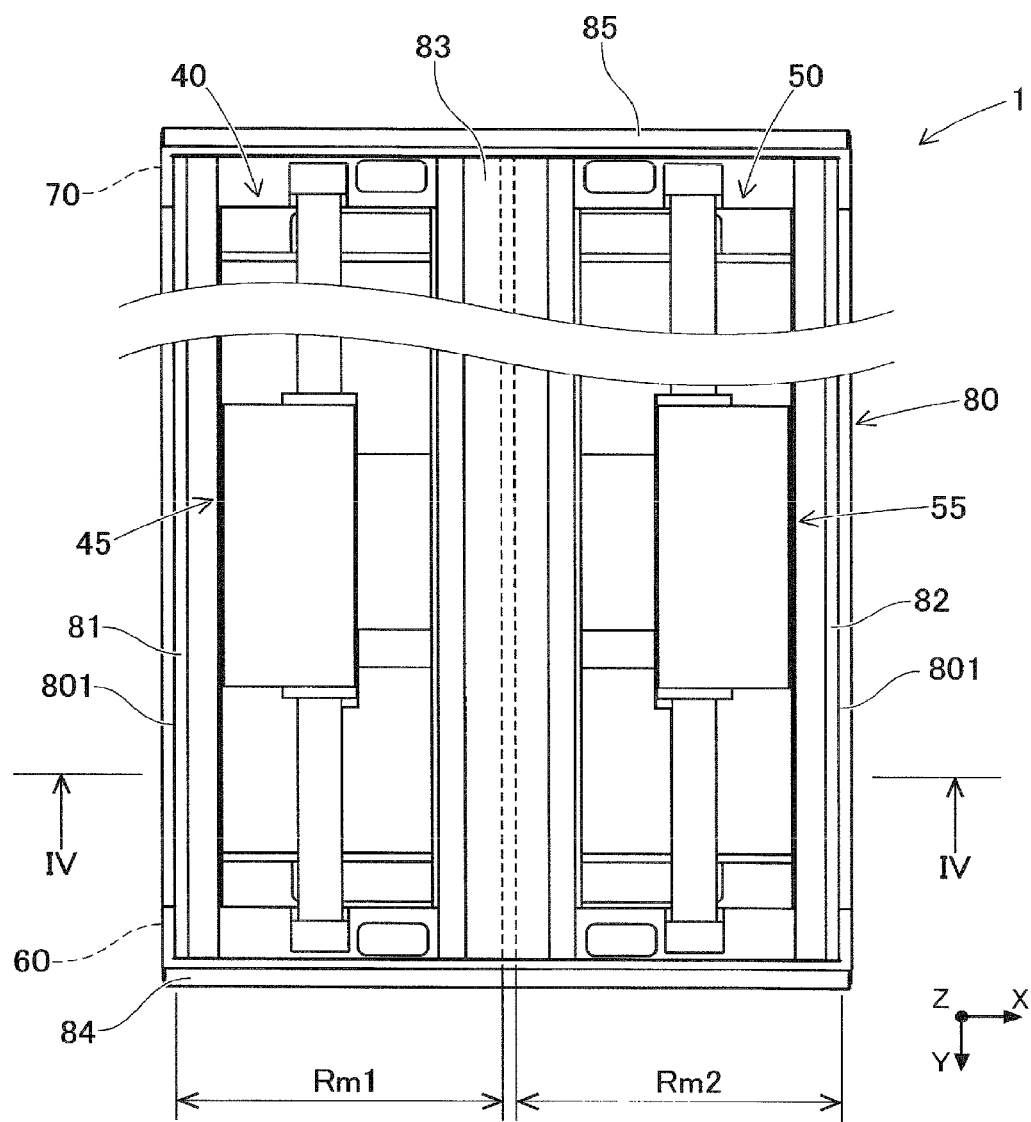
FIG. 3 An enlarged top view illustrating one of the two component mounters in FIG. 1.
Figure 4:
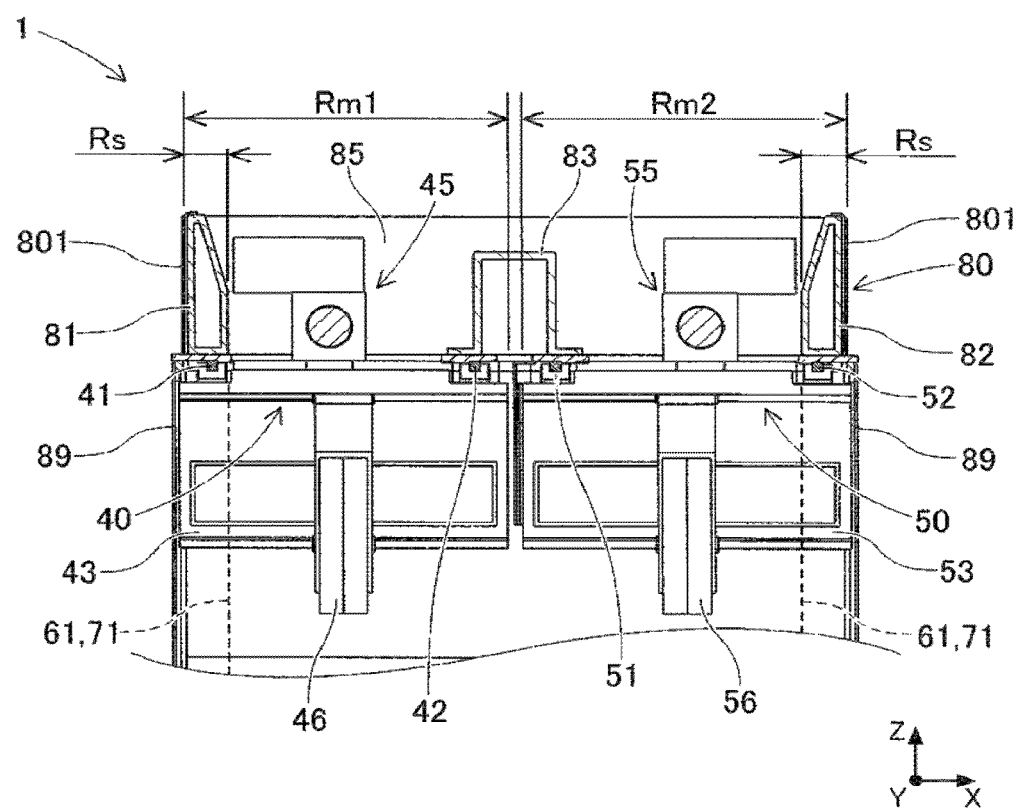
FIG. 4 A cross-sectional view taken along a line IV-IV in FIG. 3.

Two component transfer devices 30 that are configured in the way described above are disposed to be aligned side by side in the X-axis direction and are allowed to operate independently of each other. Specifically, as illustrated in FIGS. 3 and 4, respective mounting heads 35 of two component transfer devices 30 individually mount components on boards Bd in corresponding movable ranges Rm1, Rm2 that are defined above base 2 so as not to overlap each other. Here, movable ranges Rm1, Rm2 are ranges determined by a mechanical configuration of Y-axis guide device 31 and X-axis guide device 33 and are defined as a range that encircles mounting head 35 when moving mounting head 35 to both left and right ends and both front and rear ends. FIGS. 3 and 4 illustrate respective movable ranges Rm1, Rm2 of two component transfer devices 30 in the X-axis direction.

Hereinafter, for the sake of simplifying the description, as denoted by parenthesized reference numerals in FIG. 2, of two component transfer devices 30, in component transfer device 35 on a left side (an upstream side in a conveyance direction of board Bd), Y-axis guide device 31 is also referred to as first guide device 40, linear motor 32 as first drive device 45, and mounting head 35 as first head 46. Left rail 311L and right rail 311R that constitute pair of guide rails 311 of first guide device 40 are also referred to as first left rail 41 and first right rail 42, respectively.

Further, of two component transfer devices 30, in component transfer device 35 on a right side (a downstream side in the conveyance direction of board Bd), Y-axis guide device 31 is also referred to as second guide device 50, linear motor 32 as second drive device 55, and mounting head 35 as second head 56. Left rail 311L and right rail 311R that constitute pair of guide rails 311 of second guide device 50 are also referred to as second left rail 51 and second right rail 52, respectively.

1-3. Detailed Configuration of Frame Structure 80

In this embodiment, frame structure 80 is fixed to front column member 60 and rear column member 70, which each have an integral portal-like structure, while spanning these column members. In this embodiment, as illustrated in FIG. 3, frame structure 80 has a rectangular shape that surrounds an outer circumference of component mounter 1 when viewed from above. Frame structure 80 has a box-like shape that is opened downwards and upwards to thereby ensure structural rigidity thereof.

As illustrated in FIG. 3, frame structure 80 includes left frame 81, right frame 82, center frame 83, front frame 84, rear frame 85, and the like. Left frame 81 extends in the front-rear direction (the Y-axis direction) of base 2 and spans a space defined between a left end portion of front column 60 and a left end portion of rear column member 70. As illustrated in FIG. 4, in left frame 81, the external shape of a cross section at right angles to the Y-axis direction extends in an up-down direction. First left rail 41 of first guide device 40 is provided at a lower portion of left frame 81.

Right frame 82 is axially symmetric with left frame 81 with respect to the center of base 2 in the left-right direction thereof as a center line. As illustrated in FIG. 3, right frame 82 extends in the front-rear direction (the Y-axis direction) of base 2 and spans a space defined between a right end portion of front column member 60 and a right end portion of rear column member 70. As illustrated in FIG. 4, in right frame 82, the external shape of a cross section at right angles to the Y-axis direction extends in the up-down direction. Second right rail 52 of second guide device 50 is provided at a lower portion of right frame 82.

As illustrated in FIG. 3, center frame 83 is disposed between left frame 81 and right frame 82 in the X-axis direction. Center frame 83 extends in the Y-axis direction and spans a space defined between a center portion of front column member 60 and a center portion of rear column member 70. As illustrated in FIG. 4, in center frame 83, the external shape of a cross section at right angles to the Y-axis direction has a rectangular shape that extends in the up-down direction. First right rail 42 of first guide device 40 and second left rail 51 of second guide device 50 are provided at a lower portion of center frame 83.

As illustrated in FIG. 3, front frame 84 and rear frame 85 extend in the X-axis direction, and in each of front frame 84 and rear frame 85, the external shape of a cross section at right angles to the X-axis direction extends in the up-down direction. Front frame 84 connects respective upper portions of pair of front columns 61 together and also connects respective front end portions of left frame 81, right frame 82, and center frame 83 together. Rear frame 85 connects respective upper portions of pair of rear columns 71 and also connects respective rear ends of left frame 81, right frame 82, and center frame 83 together.

Here, in this embodiment, pair of front columns 61 are connected together by connecting member 62 to thereby form front column member 60, which has an integral portal-like structure. In this embodiment, pair of rear columns 71 are connected together by connecting member 72 to thereby form rear column member 70, which has an integral portal-like structure. With this configuration, the rigidity of base 2 in the left-right direction thereof can be further increased. Further, the overall rigidity of component mounter 1 is increased as a result of connecting front column member 60 and rear column member 70 being connected together by frame structure 80, thereby making it possible to reduce further a risk of generating vibrations.

In this embodiment, an outer frame of frame structure 80 connects together left frame 81, right frame 82, front frame 84, and rear frame 85 each having almost the same width in the up-down direction. In frame structure 80, center frame 83 is disposed between left frame 81 and right frame 82, fabricating a structure that increases the rigidity further. The cross sections of frames 81 to 86 are elongated in the up-down direction increasing the modulus of sectional shape, thereby increasing the bending rigidity of frame structure 80. As a result, frequencies in the X-axis direction and the Y-axis direction of vibrations generated in association with movement of first head 46 and second head 56 can be increased.

In this embodiment, frame structure 80 ensures the rigidity in the X-axis direction required for frame structure 80 (for example, the rigidity with which a frequency of vibration in the X-axis direction that is generated by a specified operation of mounting head 35 reaches a threshold value or greater) with front frame 84 and rear frame 85. As a result, frame structure 80 includes no other member configured to connect left frame 81 and right frame 82 together other than front frame 84 and rear frame 85. As a result, a reduction in weight of frame structure 80 as well as a reduction in production cost and installation cost of frame structure 80 is achieved.

As a result of adopting the configuration described above, frame structure 80 has the box-like shape that is opened in the up-down direction and ensures a space for installing first drive device 45 between left frame 81 and center frame 83 and a space for installing second drive device 55 between right frame 82 and center frame 83. Specifically, first drive device 45 is disposed between left frame 81 and center frame 83 in the X-axis direction and is supported at both end portions in the front-rear direction of base 2 by front frame 84 and rear frame 85. Similarly, second drive device 55 is disposed between right frame 82 and center frame 83 in the X-axis direction and is supported at both end portions in the front-rear direction of base 2 thereof by front frame 84 and rear frame 85.

Specifically, as illustrated in FIG. 3, first drive device 45 and second drive device 55, which are both linear motors 32, are supported at both end portions of motor shafts 321 thereof in the Y-axis direction by front frame 84 and rear frame 85. Then, first drive device 45 applies a driving force for moving first head 46 in the front-rear direction of base 2 to first moving body 43. Similarly, second drive device 55 applies a driving force for moving second head 56 in the front-rear direction of base 2 to second moving body 53.

As described above, first left rail 41 of first guide device 40 is provided at the lower portion of left frame 81. In this embodiment, as illustrated in FIG. 4, first left rail 41 is disposed within a range where movable range Rm1 of first head 46 overlaps support range Rs in the left-right direction of base 2 where pair of front columns 61 and pair of rear columns 71 are connected to frame structure 80. In FIG. 4, inner end faces of left front column 61 and left rear column 71 are indicated by broken lines.

Second right rail 52 of second guide device 50 is provided at the lower portion of right frame 82. In this embodiment, as illustrated in FIG. 4, second right rail 52 is disposed within a range where movable range Rm2 of second head 56 overlaps support range Rs in the left-right direction of base 2 where pair of front columns 61 and pair of rear columns 71 are connected to frame structure 80. In FIG. 4, inner end faces of right front column 61 and right rear column 71 are indicated by broken lines.

Here, support ranges Rs are ranges in the X-axis direction where frame structure 80 connects to front column member 60 and rear column member 70. Support ranges Rs correspond to ranges represented by a range in the X-axis direction where left frame 81 is supported directly or indirectly by one of the pair of front columns 61 and one of the pair of rear columns 71 and a range in the X-axis direction where right frame 82 is supported directly or indirectly by the other of the pair front columns 61 and the other of the pair of rear columns 71.

With such a configuration, a downward load exerted to left frame 81 from first left rail 41 is generally transmitted to left front column 61 and left rear column 71 that reside in support range Rs as a buckling load. Similarly, a downward load exerted to right frame 82 from second right rail 52 is generally transmitted to right front column 61 and right rear column 71 that reside in support range Rs as a buckling load.

As a result of the transmission of the loads in this way, first guide device 40 and second guide device 50, which generate vibrations as movement occurs, are supported with the buckling strengths of front column member 60 and rear column member 70 via frame structure 80. As a result, the overall structural rigidity of component mounter 1 is increased, thereby not only suppressing the generation of vibrations but also increasing the frequency of generated vibrations.

First right rail 42 of first guide device 40 and second left rail 51 of second guide device 50 are provided at the lower portion of center frame 83. In this embodiment, as illustrated in FIG. 4, first right rail 42 is disposed inside movable range Rm1 of first head 46 in the X-axis direction. Similarly, second left rail 51 is disposed inside movable range Rm2 of second head 56 in the X-axis direction.

Here, as illustrated in FIG. 2, pair of front columns 61 and pair of rear columns 71 both have side surfaces 611, 711, on both sides in the left-right direction (the X-axis direction) of base 2, constituting the same flat plane. This configuration is designed to enable installation of component mounter 1 as close to another adjacent component mounter 1 as possible as illustrated in FIG. 1 when a production line including component mounters 1 is configured. As a result, the production line including component mounters 1 can be shortened to thereby improve the productivity per unit area in an assembling facility.

Further, as illustrated in FIG. 1, pair of left and right connecting plates 89 are disposed on side surfaces 611 of pair of front columns 61 and side surfaces 711 of pair of rear columns 71 to connect side surfaces (611, 711) together. As a result of adopting this configuration, component mounter 1 increases its overall rigidity in the front-rear direction by making use of the tensile strength of connecting plates 89. Consequently, this configuration increases particularly the rigidity in the Y-axis direction, increasing the frequency in the Y-axis direction of vibrations generated as first head 46 and second head 56 move.

1-4. Advantageous Effects of Configuration of First Embodiment

With the configuration of component mounter 1 described above, pair of front columns 61 and pair of rear columns 71 are connected together by frame structure 80. As a result, the overall rigidity of component mounter 1 is improved by the structural rigidity of frame structure 80 while maintaining the overall external dimensions of component mounter 1. Thus, the frequency of vibrations generated as first head 46 and second head 56 move can be increased. As a result of increasing the frequency of the vibrations, suppressing and controlling the vibrations comes to be facilitated, which means an improvement in mounting accuracy is achieved by reducing the effect of the vibrations.

Additionally, in frame structure 80, first guide device 40 and second guide device 50, which are suspended, are supported by providing individual rails (41, 42, 51, 52) at the lower portions of left frame 81, right frame 82, and center frame 83. As a result of adopting this configuration, component mounter 1 reliably bears the loads of first guide device 40 and second guide device 50 with base 2, front column member 60, rear column member 70, and frame structure 80, making it possible to suppress the occurrence of vibrations that would otherwise be caused as first head 46 and second head 56 move.

2. Second Embodiment

2-1. Configuration of Component Mounter 101

Figure 5:
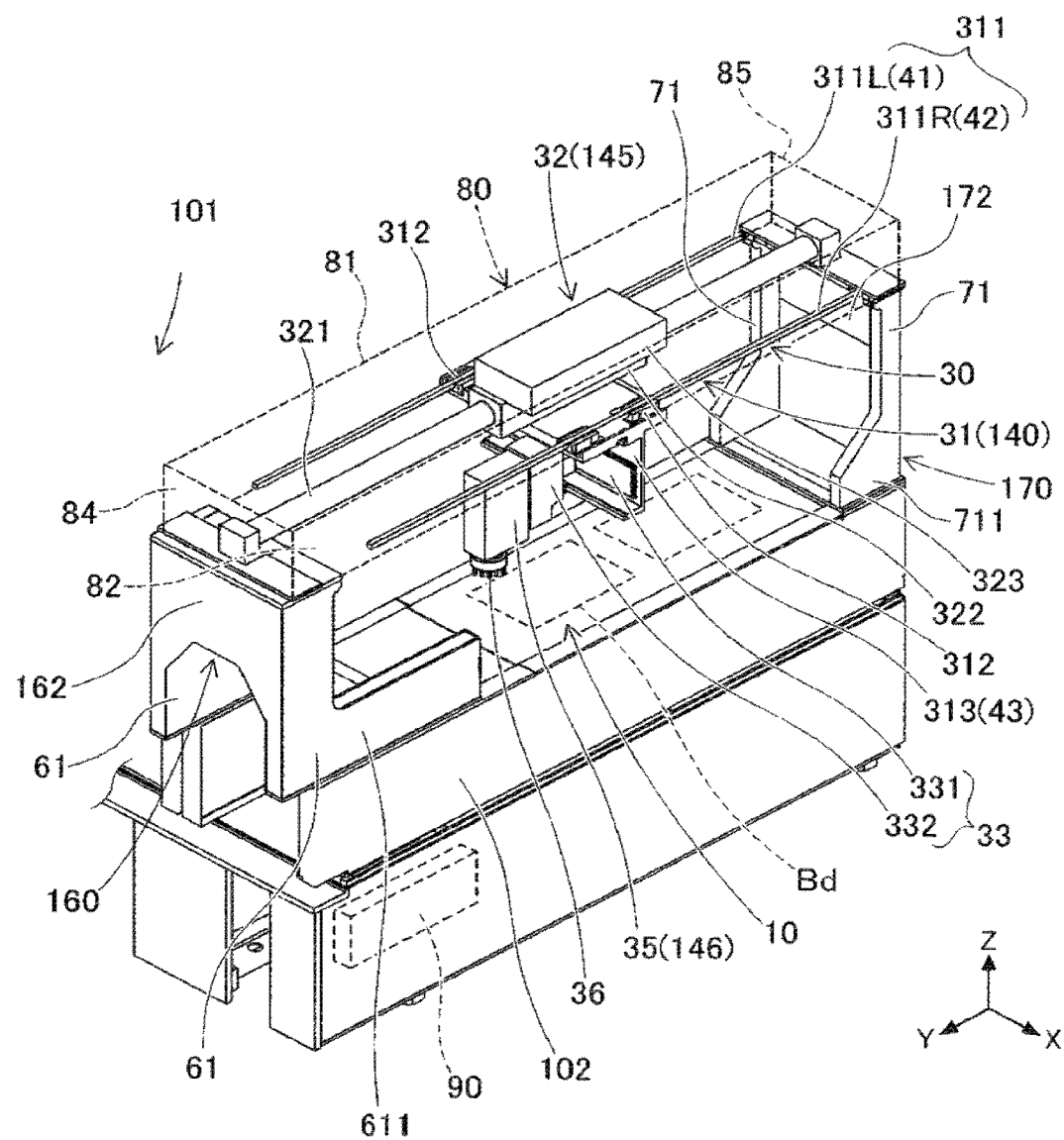
FIG. 5 An enlarged perspective view illustrating a component mounter according to a second embodiment.

A work machine (component mounter 101) of a second embodiment differs from component mounter 1 of the first embodiment mainly in the configuration of frame structure 80. Since other common configurations are substantially the same as those of the first embodiment, detailed descriptions thereof will be omitted. Specifically, as illustrated in FIG. 5, component mounter 101 includes base 102, board conveyance device 10, component supply device 20 (omitted in FIG. 5), one component transfer device 30 (first guide device 140), front column member 160, rear column member 170, frame structure 180, control device 90, and the like.

In contrast to the configuration of component mounter 1 of the first embodiment in which two component transfer devices 30 are provided, component mounter 101 of this embodiment has only one component transfer device 30. Due to this, compared with component mounter 1 of the first embodiment, widths in an X-axis direction of component mounter 101 and base 102 are generally half of those of component mounter 1. Component transfer device 30 of this embodiment is of the same type as two component transfer devices 30 of the first embodiment and includes first guide device 140, first drive device 145, first head 146, and the like.

Front column member 160 has an integral portal-like structure, which has pair of front columns 61, provided at left and right sides of a front portion of base 102, connected by connecting member 162 extending in the X-axis direction. Similarly, rear column member 170 has an integral portal-like structure, which has pair of rear columns 71 provided at left and right sides of a rear portion of base 102 connected by connecting member 172 extending in the X-axis direction.

2-2. Detailed Configuration of Frame Structure 180

Frame structure 180 is a strength member that supports one component transfer device 30 and improves the overall rigidity of component mounter 101 by connecting front column member 160 and rear column member 170 together. Frame structure 180 has a similar configuration to the configuration of frame structure 80 of the first embodiment except that center frame 83 is removed from or is not provided on frame structure 180 and includes left frame 81, right frame 82, front frame 84, rear frame 85, and the like.

Figure 6:
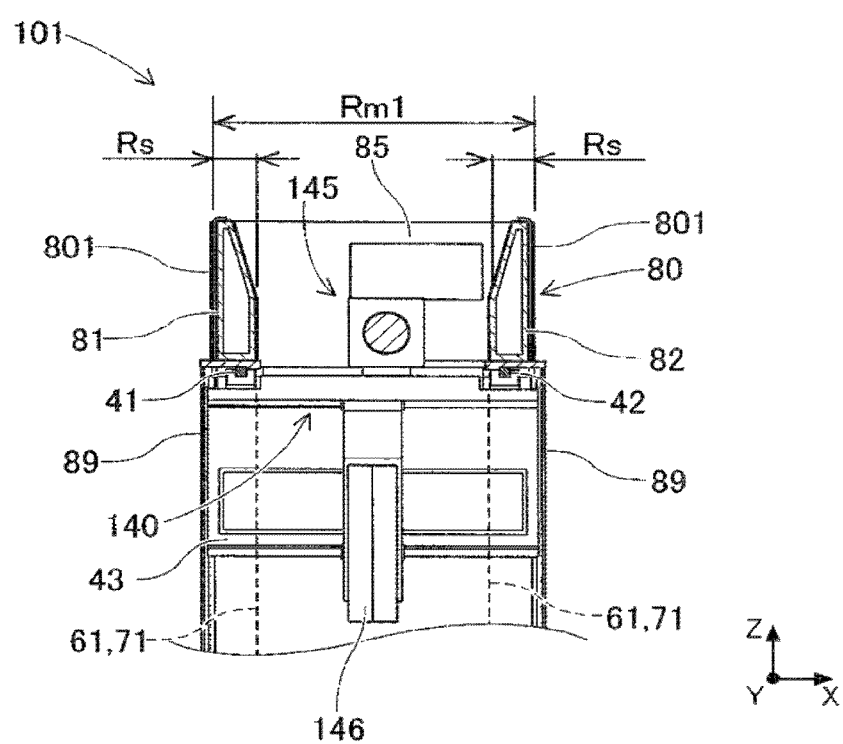
FIG. 6 A cross-sectional view, corresponding to FIG. 4, of the component mounter illustrated in FIG. 5.

As illustrated in FIG. 6, first left rail 41 of first guide device 140 is provided at a lower portion of left frame 81. First right rail 42 of first guide device 140 is provided at a lower portion of right frame 82. As in the first embodiment, front frame 84 connects pair of front columns 61 together and also connects respective front ends of left frame 81 and right frame 82 together. Rear frame 85 connects pair of rear columns 71 together and also connects respective rear ends of left frame 81 and right frame 82.

As illustrated in FIG. 6, first left rail 41 and first right rail 42 of first guide device 140 are disposed within ranges where movable range Rm1 of first head 46 overlaps support ranges Rs in a left-right direction of base 102 where pair of first front columns 61 and pair of rear columns 71 are connected to frame structure 180. In FIG. 6, inner end faces pair of front columns 61 and pair of rear columns 71 are indicated by broken lines.

First drive device 145 is disposed between left frame 81 and right frame 82. As illustrated in FIG. 5, first drive device 145 is supported at both end portions in the front-rear direction of base 102 by front frame 84 and rear frame 85. Specifically, first drive device 145, which is a linear motor 32, is supported at both end portions of motor shaft 321 in a Y-axis direction by front frame 84 and rear frame 85. First drive device 145 applies a driving force, to first moving body 43, for moving first head 146 in the front-rear direction of base 102.

As a result of adopting this configuration, as in the configuration of the first embodiment, a downward load exerted to frame structure 180 from first guide device 140 is generally transmitted to pair of front columns 61 and pair of rear columns 71 that both reside in support ranges Rs as a buckling load. As a result, first guide device 140, which can generate vibrations as it operates, is supported with the bucking strengths of front column member 160 and rear column member 170 via frame structure 180. As a result, in component mounter 101, not only is the generation of vibrations suppressed by increasing the overall structural rigidity of component mounter 101, but also the frequency of generated vibrations is increased.

2-3. Advantageous Effects of Configuration of Second Embodiment

With the configuration of component mounter 101 described above, pair of front columns 61 and pair of rear columns 71 are connected together by frame structure 180. As a result, in component mounter 101, the overall rigidity thereof is improved by the structural rigidity of frame structure 180 while maintaining the overall external dimensions of component mounter 101. Thus, the frequency of vibrations generated as first head 146 moves can be increased. As a result, suppression and control of the vibrations are facilitated, thereby reducing the effect of the vibrations and improving working accuracy.

In frame structure 180, first guide device 140, which is suspended, is supported by providing the individual rails (41, 42) at the lower portions of left frame 81 and right frame 82. As a result, in component mounter 101, the load of first guide device 140 can be reliably borne by base 102, front column member 160, rear column member 170, and frame structure 180, thereby making it possible to suppress the generation of vibrations that would otherwise be caused as first head 146 moves.

3. Modified Examples of First and Second Embodiments

3-1. Configuration of Frame Structure 80

In the first embodiment and the second embodiment, frame structures 80, 180 have a box-like shape that is opened downwards and upwards. In contrast to the configuration described above, frame structures 80, 180 may have, for example, a shape that is covered with a plate or a cover member at the upper side thereof. Additionally, as long as the overall rigidity of the frame structure can be ensured, the external shape of a cross section of at least part of each frame (81, 82, 84, 85) that constitutes the outer frame of the frame structure may have shapes other than a shape that is elongated in the up-down direction, and hence, the frame structure need not have a box-like shape.

In addition, in the first embodiment and the second embodiment, front column members 60, 160 form an integral portal-like structure as a result of pair of front columns 61 being connected together by connecting members 62, 162. In contrast to the configuration described above, front column members 60, 160 need not have connecting members 62, 162 and may be connected together only at upper portions thereof by frame structures 80, 180. Similarly, rear column members 70, 170 need not have connecting members 72, 172 and may be connected together only at upper portions thereof by frame structures 80, 180. However, from the viewpoint of securing the rigidity and reducing the number of components, the aspects exemplified in the first embodiment and the second embodiment are desirable.

3-2. Configuration of Connecting Plate 89

In the first and second embodiments, pair of connecting plates 89 are individually made to connect the respective side surfaces (611, 711) of pair of front columns 61 and pair of rear columns 71 together. In contrast to the configuration described above, in frame structures 80, 180, side surfaces 801 on both the sides in the X-axis direction may both constitute the same planar shape as the side surfaces (611, 711), and pair of front columns 61 and pair of rear columns 71 may be connected together by pair of connecting plates 89.

With this configuration, in component mounters 1, 101, the overall rigidity in the front-rear direction can be increased further by the tensile strength of pair of connecting plates 89. As a result, since the frequency of vibrations in the front-rear direction generated as mounting head 35 moves can be increased, the suppression and control of the vibrations is facilitated, thereby reducing the effect of the vibrations and improving mounting accuracy. Further, connecting plates 89 may be made to connect the side surfaces of bases 2 and 102.

3-3. Basic Configuration of Work Machine

In the first and second embodiments, first drive devices 45, 145 and second drive device 55 are each described as being linear motor 32. In contrast to the configuration described above, a linear motion device such as a ball screw device may be applied to first drive devices 45, 145 and second drive device 55, as long as the linear motion device can apply, to first moving body 43 and second moving body 53, a driving force for moving first heads 46, 146 and second head 56 in the front-rear direction (the Y-axis direction) of bases 2, 102. For example, in the case where first drive devices 45, 145 and second drive device 55 are each made up of a ball screw device, both end portions of a threaded shaft are supported by front frame 84 and rear frame 85.

In the first embodiment and the second embodiment, the work machine is described as forming component mounters 1, 101 for producing board products. In contrast to the configuration described above, the work machine may be of various types of work machines other than the component mounter, as long as such work machines are such that various types of work are performed by moving the head. Specifically, the work machine may be a solder printer that constitutes a production line together with component mounters 1, 101 or an inspection device configured to inspect circuit boards on which components are mounted.

REFERENCE SIGNS LIST

1,101: Component mounter;
2, 102: Base;
10: Board conveyance device;
20: Component supply device;
30: Component transfer device;
31 (40, 50, 140): Y-axis guide device (first guide device, second guide device),
311: Guide rail;
311L (41, 51): Left rail (first left rail, second left rail);
311R (42, 52): Right rail (first right rail, second right rail);
312: Guide block;
313(43, 53): Y-axis moving body (first moving body, second moving body);
32(45, 55, 145): Linear motor (first driving device, second driving device);
35(46, 56, 146): Mounting head (first head, second head);
60, 160: Front column member;
61: (Pair of) Front columns;
611: Side surface;
62, 162: Connecting member;
70, 170: Rear column;
71: (Pair of) Rear columns;
711: Side surface;
72, 172: Connecting member;
80, 180: Frame structure;
81: Left frame;
82: Right frame;
83: Center frame;
84: Front frame;
85: Rear frame;
801: Side surface;
89: (Pair of) Connecting plates;
Rm1: Movable range (of first mounting head);
Rm2: Movable range (of second mounting head);
Rs: Support range;
Bd: Board (Circuit board)

The invention claimed is:

1. A work machine comprising:
a base;
a front column member including a pair of front columns provided on left and right sides of a front portion of the base;
a rear column member including a pair of rear columns provided on left and right sides of a rear portion of the base;
a frame structure fixed to upper portions of the pair of front columns and upper portions of the pair of rear columns;
a first head and a second head both configured to perform predetermined work in movable ranges defined so as not to overlap each other above the base;
a first guide device provided on the frame structure on a left side of the center of the base in a left-right direction thereof and configured to allow the first head to move in a front-rear direction of the base, and
a second guide device provided on the frame structure on a right side of the center of the base in the left-right direction thereof and configured to allow the second head to move in the front-rear direction of the base;
wherein the first guide device further comprises: a first left rail and a first right rail both extending in the front-rear direction of the base, the first left rail and the first right rail being parallel, and a first moving body provided so as to move in the front-rear direction of the base while being suspended from the first left rail and the first right rail and supporting the first head;
wherein the second guide device further comprises: a second left rail and a second right rail both extending in the front-rear direction of the base, the second left rail and the second right rail being parallel, and a second moving body provided so as to move in the front-rear direction of the base while being suspended from the second left rail and the second right rail and supporting the second head; and
wherein the frame structure further comprises:
a left frame spanning from an upper side of the front column on the left side of the base to an upper side of the rear column on the left side of the base and in which the first left rail of the first guide device is provided at a lower portion thereof;
a right frame spanning from an upper side of the front column on the right side of the base to an upper side of the rear column on the right side of the base and in which the second right rail of the second guide device is provided at a lower portion thereof;
a center frame spanning from an upper side of the front column member to an upper side of the rear column member and being disposed between the left frame and the right frame, in which the first right rail of the first guide device and the second left rail of the second guide device are provided at a lower portion thereof, wherein the left frame, the right frame, and the center frame are separated from each other in the left-right direction of the base;
a front frame connecting the pair of front columns together and also connecting respective front ends of the left frame, the right frame, and the center frame together, and
a rear frame connecting the pair of rear columns together and also connecting respective rear ends of the left frame, the right frame, and the center frame together.

2. The work machine according to claim 1,
wherein the first left rail of the first guide device is disposed within a range where the movable range of the first head overlaps a support range in the left-right direction of the base where the pair of front columns and the pair of rear columns are connected to the frame structure, and
wherein the second right rail of the second guide device is disposed within a range where the movable range of the second head overlaps a support range in the left-right direction of the base where the pair of front columns and the pair of rear columns are connected to the frame structure.

3. The work machine according to claim 1,
wherein an external shape of a cross section of the center frame that is at right angles to the front-rear direction of the base has a rectangular shape that is elongated in an up-down direction.

4. The work machine according to claim 1, wherein the work machine further comprises:
a first drive device disposed between the left frame and the center frame, supported at both end portions in the front-rear direction of the base thereof by the front frame and the rear frame, and configured to apply a driving force, to the first moving body, for moving the first head in the front-rear direction of the base; and
a second drive device provided between the right frame and the center frame, supported at both end portions in the front-rear direction of the base thereof by the front frame and the rear frame, and configured to apply a driving force, to the second moving body, for moving the second head in the front-rear direction of the base.

5. The work machine according to claim 1, wherein the pair of front columns, the pair of rear columns, and the frame structure comprise side surfaces, on both sides in the left-right direction of the base, each having the same planar shape.

6. The work machine according to claim 5, wherein the work machine further comprises a pair of left and right connecting plates configured to connect the side surfaces of the pair of front columns and the pair of rear columns together.

7. The work machine of claim 6, wherein the pair of connecting plates connect individually the corresponding side surfaces of the pair of front columns, the pair of rear columns, and the frame structure together.

8. The work machine according to claim 1, wherein external shapes of cross sections of the left frame and the right frame that are at right angles to the front-rear direction of the base are elongated in the up-down direction.

9. The work machine according to claim 8,
wherein external shapes of cross sections of the front frame and the rear frame that are at right angles to the front-rear direction of the base are elongated in the up-down direction, and
wherein the frame structure has a box-like shape that is opened at least downwards.

10. The work machine according to claim 1, wherein the pair of front columns and the pair of rear columns are each connected together by a connecting member extending in the left-right direction of the base to thereby constitute an integral portal-like structure.

11. The work machine according to claim 1, wherein the frame structure has no frame configured to connect the left frame and the right frame together other than the front frame and the rear frame.

12. The work machine according to claim 1,
wherein the first head is a mounting head configured to perform mounting work of mounting an electronic component on a circuit board, and
wherein the work machine is a component mounter configured to produce a board product using the first head.

* * * * *